(12) United States Patent
Yang

(10) Patent No.: US 11,778,736 B2
(45) Date of Patent: Oct. 3, 2023

(54) DATA STORAGE DEVICE

(71) Applicant: OLOY Technology Co., Ltd., New Taipei (TW)

(72) Inventor: Bryan Yang, New Taipei (TW)

(73) Assignee: OLOY TECHNOLOGY CO., LTD., New Taipei (TW)

(*) Notice: Subject to any disclaimer, the term of this patent is extended or adjusted under 35 U.S.C. 154(b) by 170 days.

(21) Appl. No.: 17/643,379

(22) Filed: Dec. 8, 2021

(65) Prior Publication Data
US 2023/0048165 A1    Feb. 16, 2023

(30) Foreign Application Priority Data
Aug. 11, 2021    (TW) .................... 110129589

(51) Int. Cl.
*H05K 1/02*    (2006.01)
*H05K 7/20*    (2006.01)
*H05K 5/03*    (2006.01)

(52) U.S. Cl.
CPC ......... *H05K 1/0274* (2013.01); *H05K 1/0209* (2013.01); *H05K 5/03* (2013.01); *H05K 7/20509* (2013.01); *H05K 2201/10106* (2013.01)

(58) Field of Classification Search
CPC ...... H05K 1/0274; H05K 1/0209; H05K 5/03; H05K 5/026; H05K 7/20509; H05K 2201/10106; G06F 1/20; G02B 6/0001–0096; G02B 6/428; G01D 11/28; G12B 11/00; F21Y 2115/10; F21V 33/0032
See application file for complete search history.

(56) References Cited

U.S. PATENT DOCUMENTS

| | | | |
|---|---|---|---|
| 9,723,697 B1* | 8/2017 | Cheng | H05B 45/20 |
| 9,817,168 B2* | 11/2017 | Kuo | G02B 6/00 |
| 10,288,791 B2* | 5/2019 | Tseng | G02B 6/0025 |
| 10,429,568 B2* | 10/2019 | Cheng | G11C 5/04 |
| 2017/0343198 A1* | 11/2017 | Ning | G11C 5/04 |

* cited by examiner

*Primary Examiner* — Amir A Jalali
(74) *Attorney, Agent, or Firm* — Hamre, Schumann, Mueller & Larson, P.C.

(57) ABSTRACT

A data storage device includes a memory module including a circuit board, a plurality of light emitting elements and a light guiding unit. The light emitting elements are electrically connected to the circuit board. The light guiding unit includes a light-homogenizing plate and a light output portion. The plate is disposed between the light output portion and the light emitting elements. A light diffusion space is disposed between the plate and the light output portion. The light emitted by the light emitting elements propagates sequentially into the plate, the light diffusion space, and the light output portion and then is output through the light output portion.

7 Claims, 6 Drawing Sheets

DATA STORAGE DEVICE

CROSS-REFERENCE TO RELATED APPLICATION

This application claims priority of Taiwanese Patent Application No. 110129589, filed on Aug. 11, 2021.

FIELD

The disclosure relates to an electronic device, more particularly to a data storage device.

BACKGROUND

With the development of electronic sports (abbreviated as Esports) and the miniaturization of a light emitting element, e.g., light emitting diode (LED), a case of a computer for Esports is made to be transparent to increase the visual effect so that components disposed in the case can be seen. Some components in the case are provided with a plurality of light emitting elements to emit light with different patterns, e.g., having different colors, during use so as to provide appealing visual effects to the computer. For example, a computer memory disposed in the case of a computer for Esports is one of the components that is provided with light emitting elements to emit light.

Generally, a plurality of LEDs are disposed on a circuit board of the computer memory, and a light guiding strip is disposed on a board edge of the circuit board to homogenize the light emitted by the LEDs so as to prevent glare. Since the LEDs are distributed to be spaced apart from one another, it is required to dispose a light-homogenizing layer having a thickness of at least 8 millimeters (mm) in the light-guiding strip to homogenize the light emitted by the LEDs to prevent uneven illumination of the light output through the light guiding strip.

SUMMARY

Therefore, an object of the disclosure is to provide a data storage device that is capable of decreasing an overall size of the computer memory of the prior art.

According to an aspect of the disclosure, a data storage device includes a memory module and a light emitting module. The memory module includes a circuit board. The light emitting module includes a plurality of light emitting elements, a light guiding unit, and a heat dissipating unit. The light emitting elements are disposed on the circuit board and electrically connected to the circuit board. The light emitting elements are adapted to emit light. The light guiding unit includes a light-homogenizing plate and a light output portion. The light emitting elements are disposed at a side of the light-homogenizing plate such that light emitted by the light emitting elements is transmitted into and homogenized by the light-homogenizing plate. The light output portion is disposed at an opposite side of the light-homogenizing plate and is spaced apart from the light-homogenizing plate such that a light diffusion space is disposed between the light-homogenizing plate and the light output portion. The light emitted by the light emitting elements propagates sequentially into the light-homogenizing plate, the light diffusion space, and the light output portion and then is output through the light output portion. The heat dissipating unit is in thermal contact with the memory module, holds the light guiding unit, and includes two side walls spaced apart from each other and covering the light-homogenizing plate and the light diffusion space.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
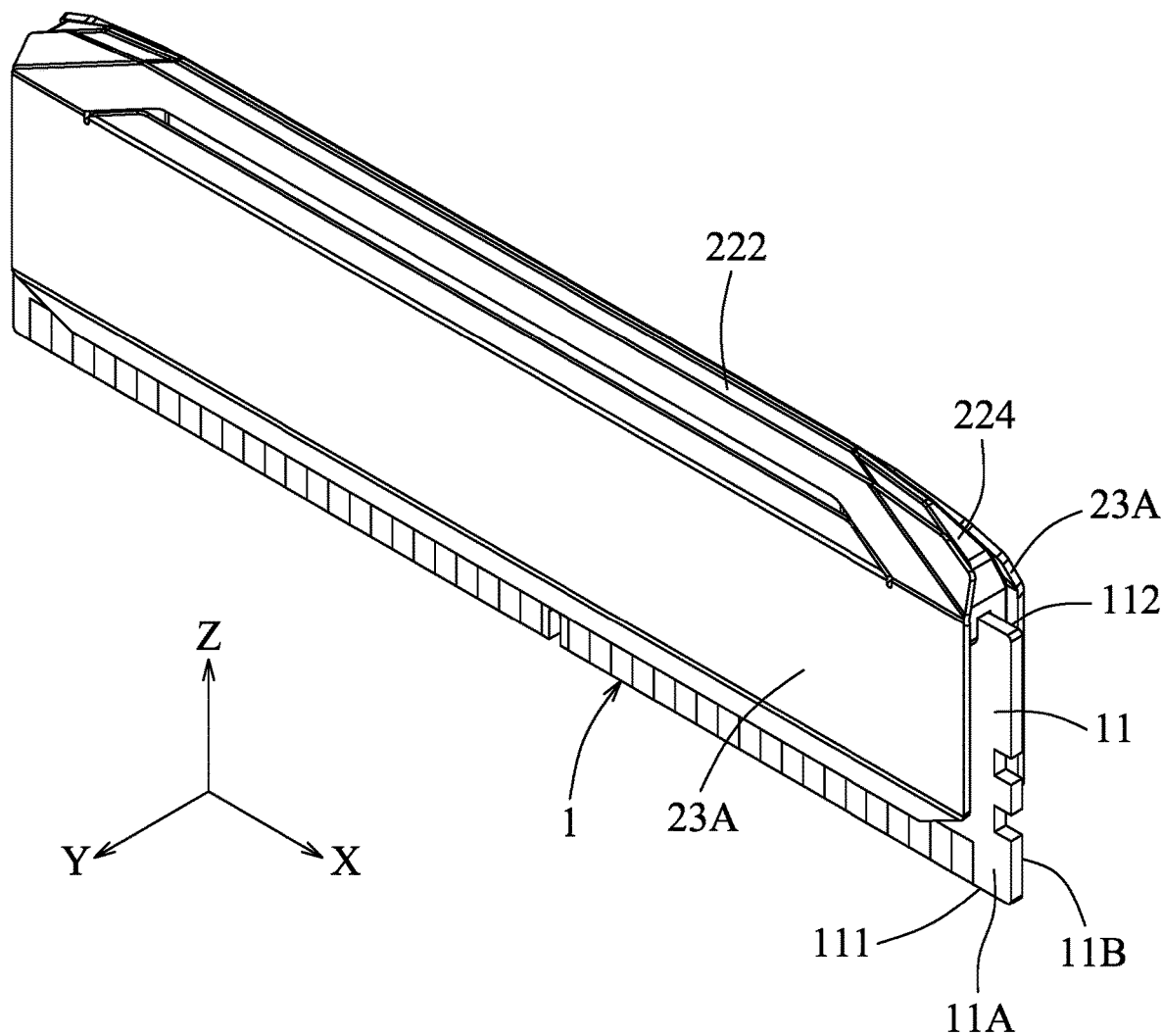
FIG. 1 is a perspective view of a first embodiment of a data storage device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
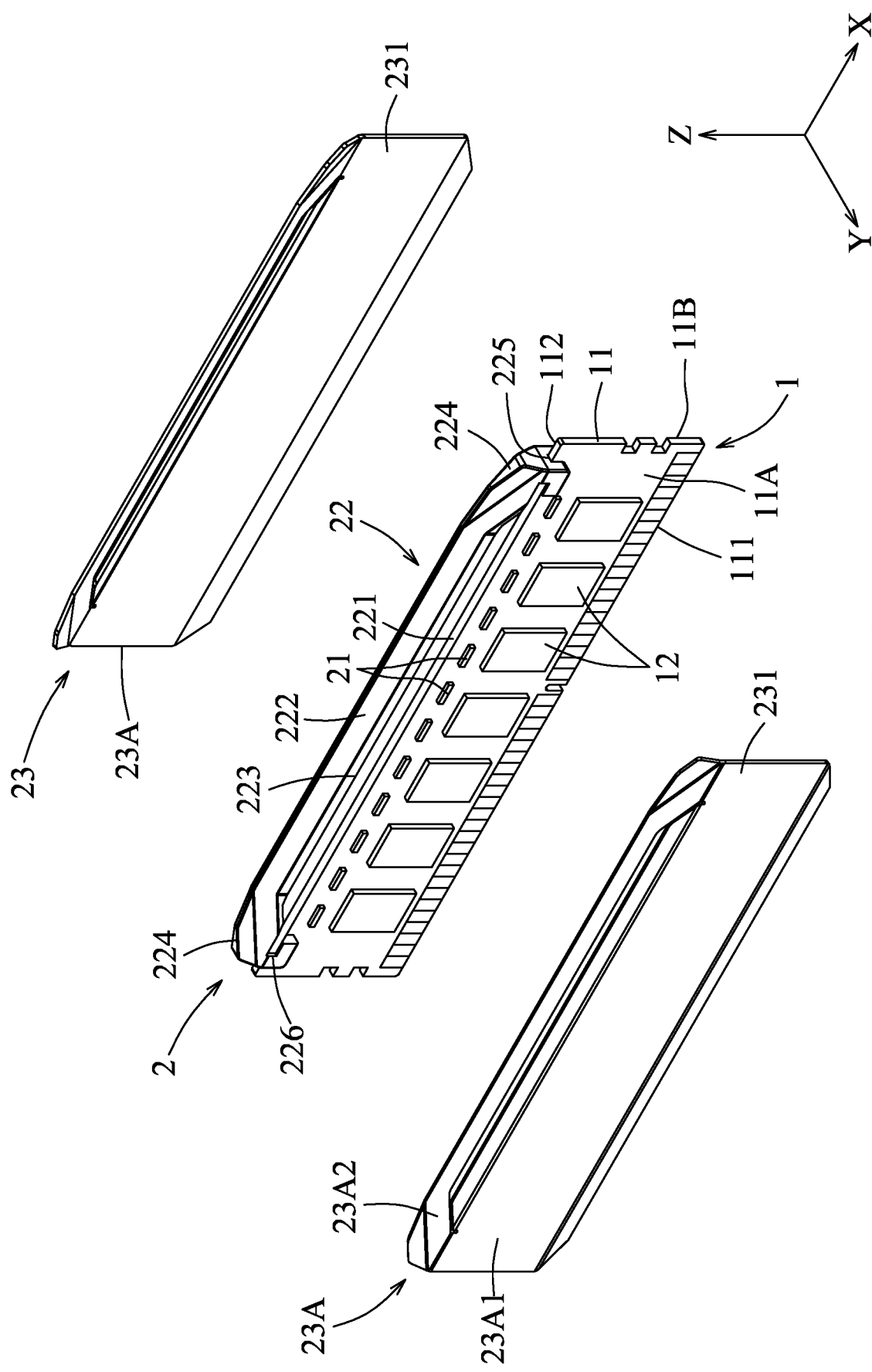
FIG. 2 is a partly exploded perspective view of the first embodiment.

Referring to FIGS. 1 and 2, a first embodiment of a data storage device according to the present disclosure includes a memory module 1 and a light emitting module 2. In the first embodiment, the memory module is a memory of a computer and includes a circuit board 11 extending along a left-right direction (X) and a plurality of chips 12 disposed on the circuit board 11.

The circuit board 11 has a first board edge 111 inserted to an electrical connector (not shown), a second board edge 112 opposite to the first board edge 111 along an up-down direction (Z) transverse to the left-right direction (X), and two board surfaces 11A, 11B opposite to each other along a front-rear direction (Y) transverse to the left-right direction (X) and the front-rear direction (Y) and interconnecting the first board edge 111 and the second board edge 112. In this embodiment, the first board edge 111 and the second board edge 112 are respectively located at the bottom and top ends of the circuit board 11. The chips 12 are disposed on the board surfaces 11A, 11B and the chips 12 disposed on each of the board surfaces 11A, 11B are spaced apart from one another along the left-right direction (X).

The light emitting module 2 includes a plurality of light emitting elements 21, a light guiding unit 22 and a heat dissipating unit 23.

The light emitting elements 21 are disposed on the board surface 11A of the circuit board 11 and electrically connected to the circuit board 11, and are adapted to emit light. In this embodiment, the light emitting elements 21 emit light upwardly, and the light emitting elements 21 are light emitting diodes (LED) arranged adjacent to the second board edge 112, spaced apart from one another long the left-right direction (X), and adapted to emit light toward the second board edge 112. That is to say, directions of the light beams emitted by the light emitting elements 21 are parallel to the board surfaces 11A, 11B. The light guiding unit 22 extends along the left-right direction (X), is elongated, and is disposed adjacent to the second board edge 112.

Referring to FIGS. 2 to 5, the light guiding unit 22 includes a light-homogenizing plate 221 and a light output portion 222. The light emitting elements 21 are disposed at a side of the light-homogenizing plate 221 such that light emitted by the light emitting elements 21 is transmitted into and homogenized by the light-homogenizing plate 221. The light output portion 222 is disposed at an opposite side of the light-homogenizing plate 221 and is spaced apart from the light-homogenizing plate 221 along the up-down direction (Z) such that a light diffusion space 223 is disposed between the light-homogenizing plate 221 and the light output portion 222. The light emitted by the light emitting elements 21 propagates sequentially into the light-homogenizing plate 221, the light diffusion space 223, and the light output portion 222 and then is output through the light output portion 222. In this embodiment, the light homogenizing plate 221 is made of a plastic material such as polycarbonate (PC) and poly methyl methacrylate so as to homogenize light emitted from the light emitting elements 21. By virtue of the structure of the light diffusion space 223 disposed between the light-homogenizing plate 221 and the light output portion 222, a thickness of the light-homogenizing plate 221 is smaller as compared to the conventional light guiding strip described in the background section and a more even illuminance effect can be provided by the present disclosure.

Specifically, the light-homogenizing plate 221 has a first light incident surface 221a facing the light emitting elements 21, and a first light exiting surface 221b facing away from the light emitting elements 21. The light output portion 222 has a second light incident surface 222a that faces and that is spaced apart from the first light exiting surface 221b. The light-homogenizing plate 221 has a thickness (T1) along the up-down direction (Z) being not smaller than 2 millimeters (mm). The thickness (T1) of the light-homogenizing plate 221 provides a relatively good mechanical strength and thus the light-homogenizing plate 221 is not easy to break. The thickness of the light-homogenizing plate 221 is not limited to the example described above, but is preferably smaller than 2 centimeters (cm) under consideration of actual use. The first light exiting surface 221b and the second light incident surface 222a cooperate with each other to define a dimension (T2) of the light diffusion space 223 along the up-down direction (Z) that is not smaller than 2 mm. As compared to the conventional light guiding strip having a thickness of at least 8 mm, a more even illumination can be provided by the present disclosure with the light-homogenizing plate 221 having a thickness of 2 mm and the light diffusion space 223 being not smaller than 2 mm. In this way, the material for making the light-homogenizing plate 221 can be reduced and the overall dimension occupied by the light guiding unit 22 is relatively small. It should be noted that the dimension (T2) of the light-homogenizing plate 221 is not limited to the example described herein, but is preferably smaller than 2 cm under consideration of actual use.

Figure 3:
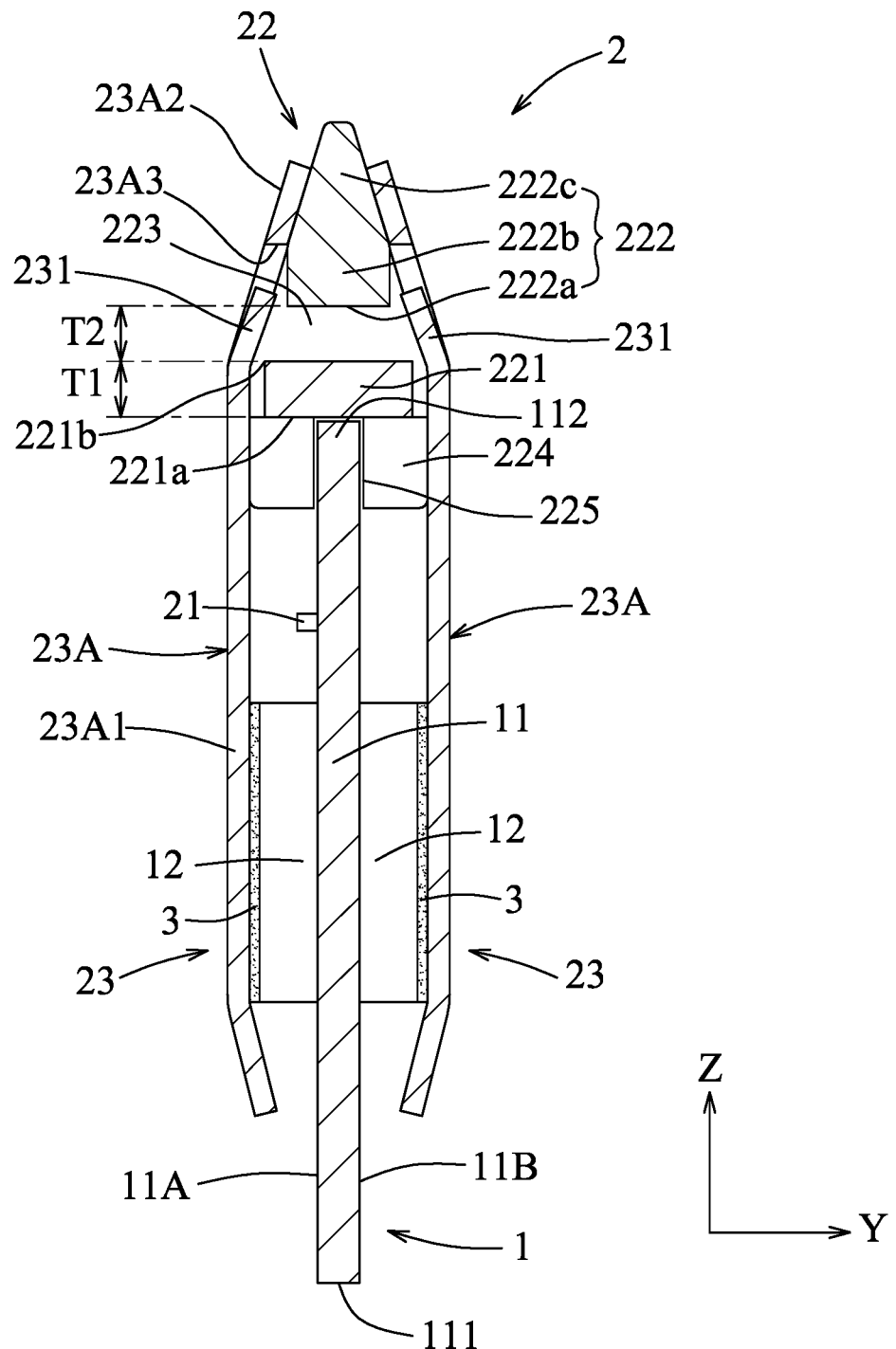
FIG. 3 is a schematic sectional view of the first embodiment.
Figure 4:
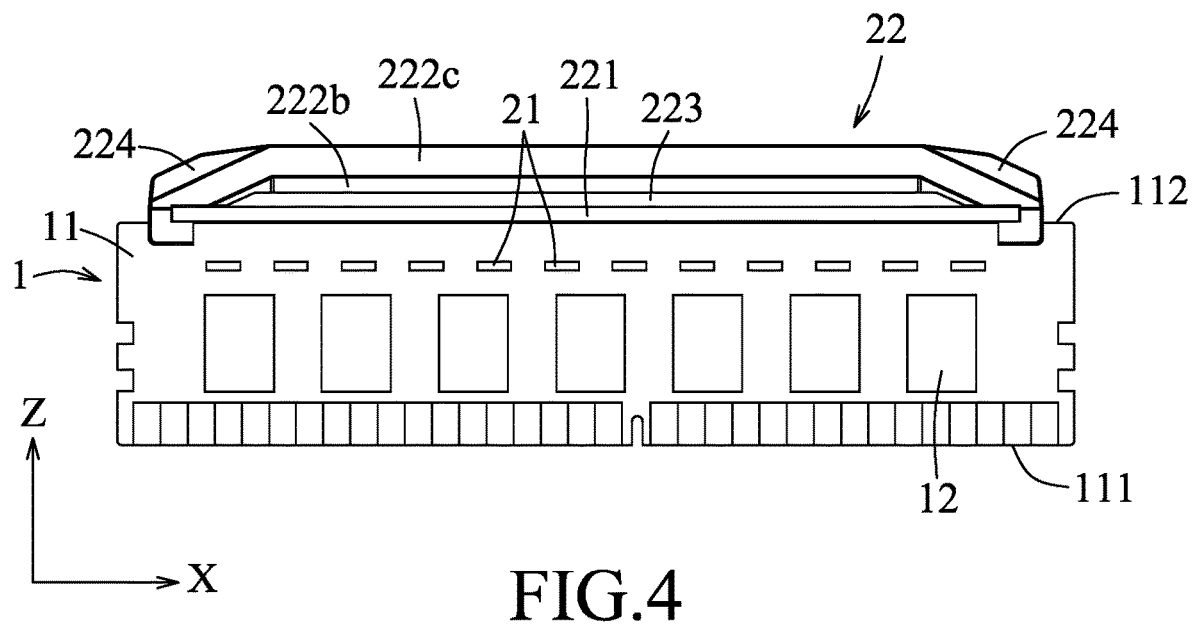
FIG. 4 is an elevational view of the first embodiment.
Figure 5:
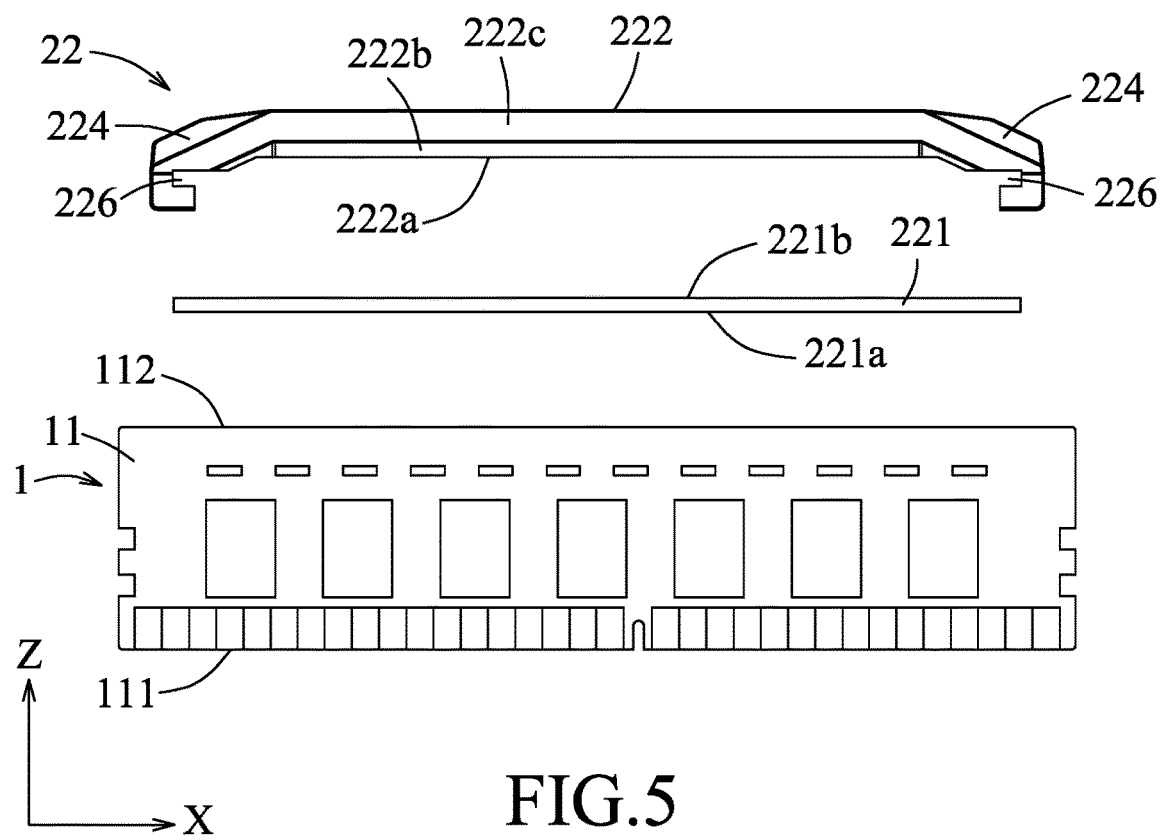
FIG. 5 is a partly exploded elevational view of FIG. 4.

In the first embodiment, the light-homogenizing plate 221 is disposed adjacent to the second board edge 112 and the first light incident surface 221a is perpendicular to the board surfaces 11A, 11B of the circuit board 11. As shown in FIG. 3, the light output portion 222 has a width along the front-rear direction (Y) smaller than that of the light-homogenizing plate 221, and includes an equal-width segment 222b disposed adjacent to the light-homogenizing plate 221, having a uniform thickness along the front-rear direction (Y), and formed with the second light incident surface 222a, and a tapered segment 222c tapering from the equal-width segment 222b away from the light-homogenizing plate 221 along the up-down direction (Z). The light guiding unit 22 further includes two connecting portions 224 connected respectively and integrally to two ends of the light output portion 222 that are opposite to each other along the left-right direction (X). As shown in FIGS. 2, 3 and 5, each of the connecting portions 224 is formed with a limiting slot 225 extending along the up-down direction (Z) and engaging the second board edge 112, and an engaging groove 226 extending along the front-rear direction (Y). The engaging grooves 226 of the connecting portions 224 engage respectively two ends of the light-homogenizing plate 221 that are opposite to each other along the left-right direction (X). The light output portion 222 is made of light transmissive plastic material such as PC. The connecting portions 224 extend respectively from two ends of the light output portion 222 that are opposite to each other along the left-right direction (X) away from each other, and each of the connecting portions 224 has a protrusion extending downwardly toward the circuit board 11. The limiting slot 225 and the engaging groove 226 of each of the connecting portions 224 are formed in the protrusion of a corresponding one of the connecting portions 224. The engaging grooves 226 of the connecting portions 224 indent respectively from inner edges of the protrusions of the connecting portions 224 along the left-right direction (X) and cooperate with each other to position the light-homogenizing plate 221 therebetween, such that the light-homogenizing plate 221 is positioned relative to and spaced apart from the light output portion 222 to form the light diffusion space 223. The limiting slot 225 of each of the connecting portions 224 indents from the middle of a lower edge of each of the protrusions of the connecting portions 224 along the up-down direction (Z) and engages the second board edge 112 of the circuit board 11.

The heat dissipating unit 23 is in thermal contact with the memory module 1, holds the light guiding unit 22, and includes two side walls 231 spaced apart from each other along the front-rear direction (Y) and covering the light-homogenizing plate 221 and the light diffusion space 223. The side walls 231 reflect the light emitted by the light emitting elements 21. The heat dissipating unit 23 is made of, e.g., metal, and includes two heat conducting plates 23A disposed respectively adjacent to the board surfaces 11A, 11B of the circuit board 11. Each of the heat conducting plates 23A includes a connecting plate portion 23A1 connected fixedly to the memory module 1, and a confining plate portion 23A2 bending and extending from one side of the connecting plate portion 23A1 that is adjacent to the second board edge 112. The confining plate portions 23A2 of the heat conducting plates 23A extend toward each other to hold the light output portion 222. The connecting plate portion 23A1 and the confining plate portion 23A2 of each of the heat conducting plates 23A constitute a respective one of the side walls 231. The confining plate portion 23A2 of each of the heat conducting plates 23A is formed with a hollowed region 23A3 corresponding in position to the equal-width segment 222b to permit the light emitted by the light emitting elements 21 to be output therethrough. In this embodiment, the connecting plate portions 23A1 are adhered to the chips 12 of the memory module 1 via thermal adhesive 3 (see FIG. 3).

Figure 6:
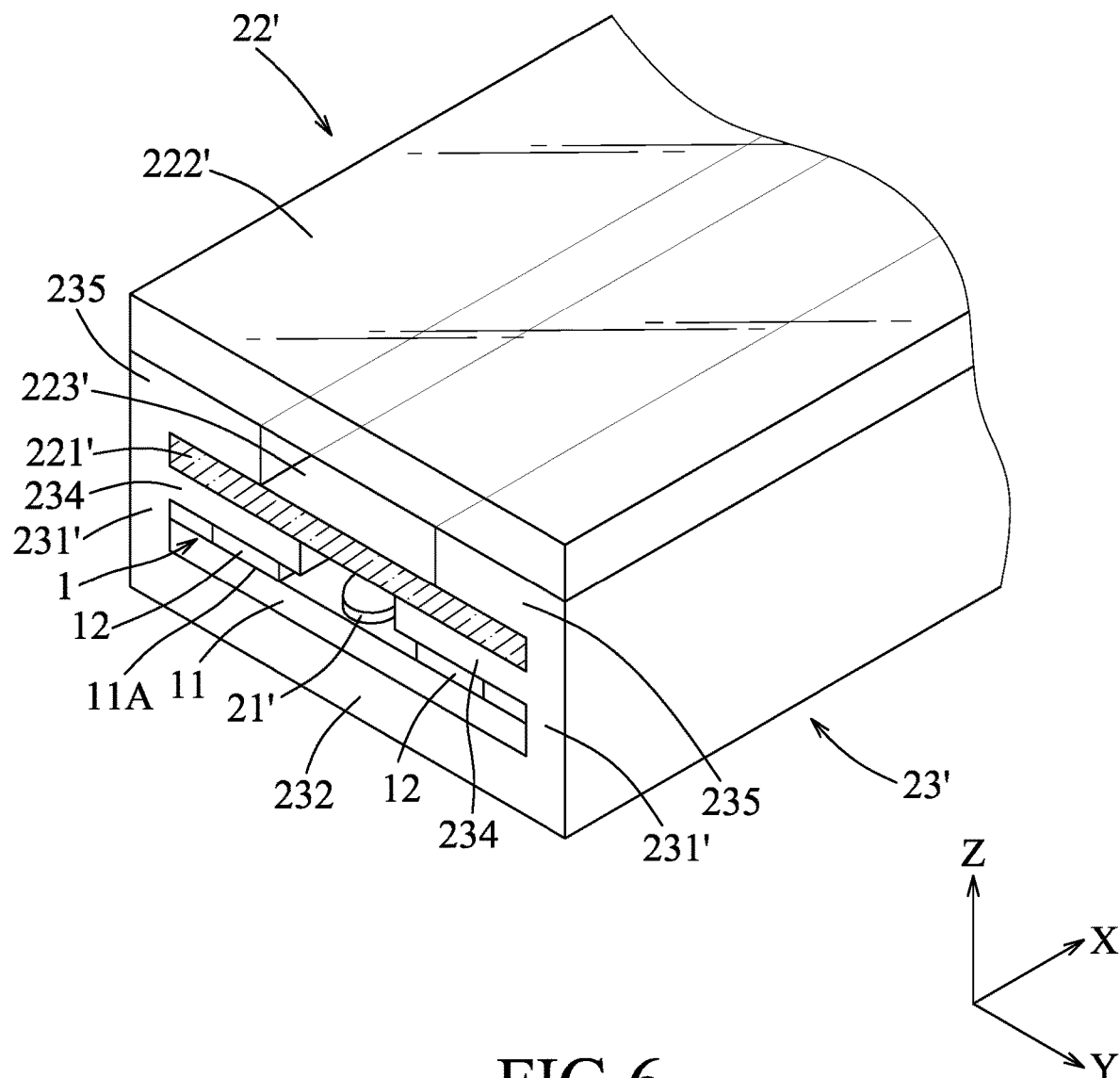
FIG. 6 is a fragmentary perspective view of a second embodiment of the data storage device according to the present disclosure.
Figure 7:
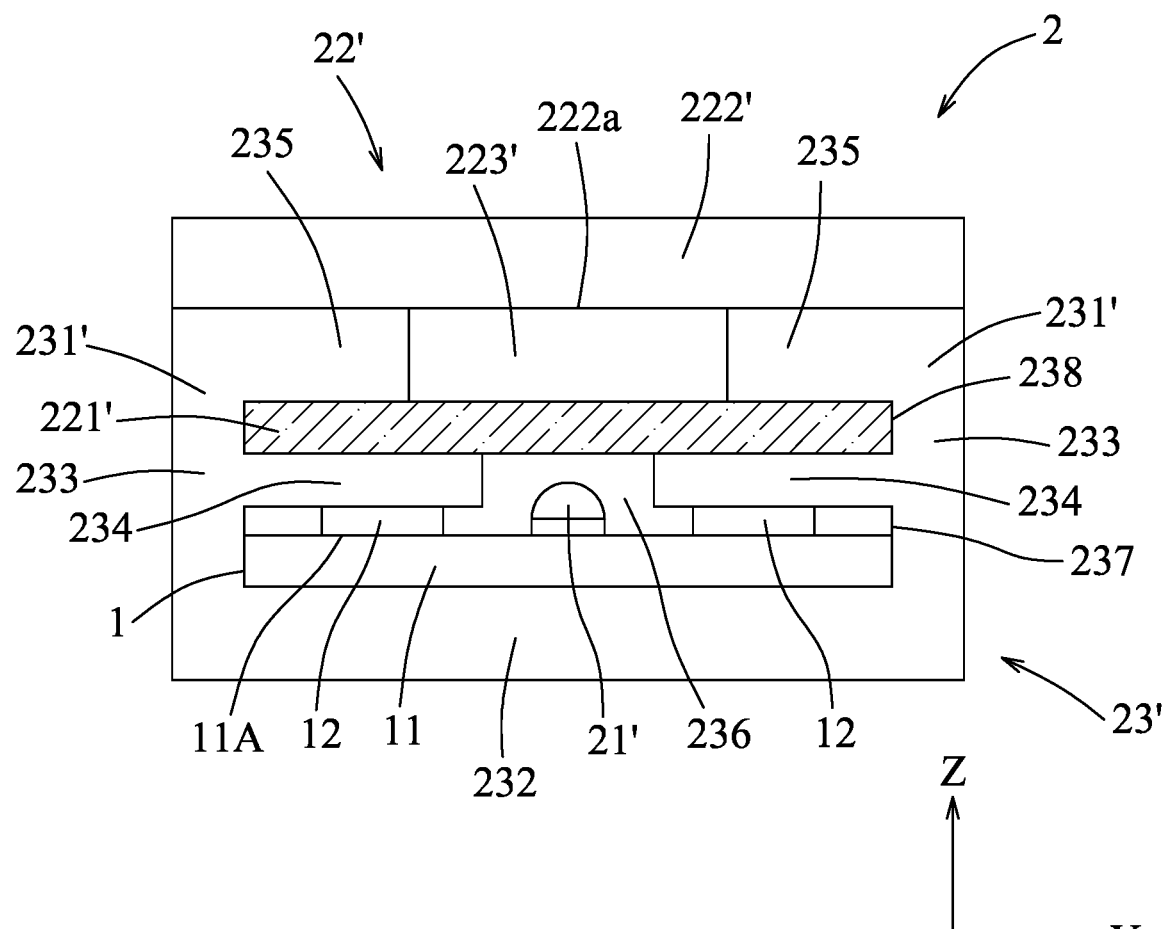
FIG. 7 is a partly sectional schematic elevational view of the second embodiment.

Referring to FIGS. 6 and 7, a second embodiment of the data storage device according to the present disclosure is implemented as a USB disk and includes a memory module 1 and a light emitting module 2'. The memory module 1 includes a circuit board 11 and a plurality of chips 12 disposed on a board surface 11A of the circuit board 11. The light emitting module 2' includes a plurality of light emitting elements 21' (only one is visible), a light guiding unit 22' and a heat dissipating unit 23'.

The light emitting elements 21' are disposed on and electrically connected to the board surface 11A of the circuit board 11. In the second embodiment, the light emitting elements 21' emit light in a direction perpendicular to the board surface 11A of the circuit board 11 along the up-down direction (Z).

The light guiding unit 22' of the second embodiment is similar to that of the first embodiment and includes a light-homogenizing plate 221' and a light output portion 222'. The difference between the second and the first embodiment resides in that the light-homogenizing plate 221' is parallel to the circuit board 11' and the light output portion 222' is configured as a plate.

In the second embodiment, the heat dissipating unit 23' is a metal casing and includes two side walls 231' and a connecting wall 232 interconnecting the side walls 231'. Each of the side walls 231' includes an upright wall portion 233 extending along the up-down direction (Z) and connected perpendicularly to the connecting walls 232, a first transverse wall portion 234 extending from the upright wall portion 233 along the front-rear direction (Y) and spaced apart from the connecting wall 232 along the up-down direction (Z), and a second transverse wall portion 235 extending from the upright wall portion 233 along the front-rear direction (Y), spaced apart from the first transverse wall portion 234 along the up-down direction (Z) and disposed farther from the circuit board 11 than the first transverse wall portion 234. The first transverse wall portions 234 of the side walls 231 extend toward and are spaced apart from each other to form a light channel 236 therebetween, and cooperate with the connecting wall 232 to form a first receiving space 237 for accommodating the circuit board 11 therein. The second transverse wall portions 235 of the side walls 231' extend toward and are spaced apart from each other to define the light diffusion space 223' therebetween, and cooperate with the first transverse wall portions 234 to form a second receiving space 238 for receiving the light-homogenizing plate 221 therein. The light output portion 222 is connected to the second transverse wall portions 235 at the second light incident surface 222a. The light emitting elements 21 are adapted to emit the light toward the light channel 236. In this embodiment, the light emitted by the light emitting elements 21 propagates sequentially into the light-homogenizing plate 221', the light diffusion space 223' and then is output through the light output portion 222'. The second embodiment possesses the same light-homogenizing effect as the first embodiment does.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. A data storage device, comprising:
   a memory module including a circuit board; and
   a light emitting module including
   a plurality of light emitting elements disposed on said circuit board and electrically connected to said circuit board, said light emitting elements being adapted to emit light,
   a light guiding unit including a light-homogenizing plate, said light emitting elements being disposed at a side of said light-homogenizing plate such that light emitted by said light emitting elements is transmitted into and homogenized by said light-homogenizing plate, and a light output portion which is disposed at an opposite side of said light-homogenizing plate and which is spaced apart from said light-homogenizing plate such that a light diffusion space is disposed between said light-homogenizing plate and said light output portion, the light emitted by said light emitting elements propagating sequentially into said light-homogenizing plate, said light diffusion space, and said light output portion and then being output through said light output portion, and
   a heat dissipating unit in thermal contact with said memory module, holding said light guiding unit, and including two side walls spaced apart from each other and covering said light-homogenizing plate and said light diffusion space.

2. The data storage device as claimed in claim 1, wherein said light-homogenizing plate has a first light incident surface facing said light emitting elements, and a first light exiting surface facing away from said light emitting elements, said light output portion having a second light incident surface facing and spaced apart from said first light exiting surface, said light-homogenizing plate having a thickness along a first direction, along which said first light exiting surface and said second light incident surface are spaced apart, being not smaller than 2 millimeters (mm), said first light exiting surface and said second light incident surface cooperating with each other to define a dimension of said light diffusion space along the first direction that is not smaller than 2 mm.

3. The data storage device as claimed in claim 2, wherein the thickness of said light-homogenizing plate is not larger than 2 centimeters (cm), and the dimension of said light diffusion space is not larger than 2 cm.

4. The data storage device as claimed in claim 2, wherein said circuit board has a first board edge adapted to be connected to an electrical connector, a second board edge opposite to said first board edge along the first direction, and two board surfaces opposite to each other along a second direction transverse to the first direction and interconnecting said first board edge and said second board edge, said light emitting elements being adapted to emit light toward said second board edge, said light-homogenizing plate being disposed adjacent to said second board edge, said first light incident surface being perpendicular to said board surfaces of said circuit board, said light guiding unit further including two connecting portions connected respectively and integrally to two ends of said light output portion that are opposite to each other along a third direction transverse to the first direction and the second direction, each of said connecting portions being formed with a limiting slot extending along the first direction and engaging said second board edge, and an engaging groove extending along the second direction, said engaging grooves of said connecting portions engaging respectively two ends of said light-homogenizing plate that are opposite to each other along the third direction.

5. The data storage device as claimed in claim 4, wherein said light output portion has a width along the second direction smaller than that of said light-homogenizing plate, and includes:
- an equal-width segment disposed adjacent to said light-homogenizing plate, having a uniform thickness along the second direction, and formed with said second light incident surface; and
- a tapered segment tapering from said equal-width segment away from said light-homogenizing plate;

said heat dissipating unit including two heat conducting plates disposed respectively adjacent to said board surfaces of said circuit board, each of said heat conducting plates including a connecting plate portion connected fixedly to said memory module, and a confining plate portion bending and extending from one side of said connecting plate portion that is adjacent to said second board edge, said confining plate portions of said heat conducting plates extending toward each other to hold said light output portion, said connecting plate portion and said confining plate portions of each of said heat conducting plates constituting a respective one of said side walls.

6. The data storage device as claimed in claim 5, wherein said confining plate portion of each of said heat conducting plates is formed with a hollowed region corresponding in position to said equal-width segment to permit the light emitted by said light emitting elements to be output therethrough.

7. The data storage device as claimed in claim 2, wherein said heat dissipating unit further includes a connecting wall interconnecting said side walls, each of said side walls including an upright wall portion extending along the first direction and connected perpendicularly to said connecting wall, a first transverse wall portion extending from said upright wall portion along a second direction transverse to the first direction and spaced apart from said connecting wall along the first direction, and a second transverse wall portion extending from said upright wall portion along the second direction and spaced apart from said first transverse wall portion along the first direction, said first transverse wall portions of said side walls extending toward and spaced apart from each other to form a light channel therebetween, and cooperating with said connecting wall to form a first receiving space for accommodating said circuit board therein, said second transverse wall portions of said side walls extending toward and spaced apart from each other to define said light diffusion space therebetween, and cooperating with said first transverse wall portions to form a second receiving space for receiving said light-homogenizing plate therein, said light output portion being configured as a plate, and being connected to said second transverse wall portions at said second light incident surface, said light emitting elements being adapted to emit the light toward said light channel.

* * * * *